United States Patent
Kang

(10) Patent No.: US 8,415,809 B2
(45) Date of Patent: Apr. 9, 2013

(54) FLIP CHIP OVERMOLD PACKAGE

(75) Inventor: Teck-Gyu Kang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 208 days.

(21) Appl. No.: 12/166,490

(22) Filed: Jul. 2, 2008

(65) Prior Publication Data

US 2010/0001410 A1   Jan. 7, 2010

(51) Int. Cl.
   *H01L 23/48* (2006.01)
   *H01L 23/52* (2006.01)
   *H01L 29/40* (2006.01)

(52) U.S. Cl. ........ 257/778; 257/706; 257/712; 438/108; 438/126

(58) Field of Classification Search .............. 257/706, 257/712, 778; 438/15, 51, 122, 108, 126
   See application file for complete search history.

(56) References Cited

U.S. PATENT DOCUMENTS

| | | | |
|---|---|---|---|
| 5,216,283 A * | 6/1993 | Lin | 257/787 |
| 5,909,056 A * | 6/1999 | Mertol | 257/704 |
| 6,046,077 A * | 4/2000 | Baba | 438/127 |
| 6,433,412 B2 | 8/2002 | Ando et al. | |
| 6,555,924 B2 | 4/2003 | Chai et al. | |
| 7,042,084 B2 * | 5/2006 | Takeuchi | 257/706 |
| 7,276,393 B2 * | 10/2007 | Derderian et al. | 438/51 |
| 2005/0263865 A1 * | 12/2005 | Wu | 257/678 |
| 2005/0269716 A1 * | 12/2005 | Lee et al. | 257/783 |
| 2007/0164448 A1 | 7/2007 | Kim et al. | |
| 2007/0181997 A1 * | 8/2007 | Ahr et al. | 257/712 |

FOREIGN PATENT DOCUMENTS

JP   10-209327   8/1998

* cited by examiner

*Primary Examiner* — Kimberly Rizkallah
*Assistant Examiner* — Errol Fernandes
(74) *Attorney, Agent, or Firm* — Womble Carlyle Sandridge & Rice, LLP

(57) ABSTRACT

An integrated circuit (IC) package having a packaging substrate, an IC disposed onto the packaging substrate, and a rigid support member attached to the substrate layer through an adhesive spacer is provided. The packaging substrate includes multiple decoupling capacitors positioned thereon around the IC. A heat sink is placed over the IC. The rigid support member provides enhanced structural support for the IC packaging and there is ample space between a bottom surface of the rigid support member and the packaging substrate to allow the placement of the decoupling capacitors underneath the rigid support member.

17 Claims, 4 Drawing Sheets

US 8,415,809 B2

FLIP CHIP OVERMOLD PACKAGE

BACKGROUND

Integrated circuits (IC) are at the core of almost all modern digital systems. As the use of semiconductor devices becomes more prevalent, more and more requirements are placed on a chip. The challenge is therefore to fit more processing power into a single IC package to accommodate customer demands.

This challenge has been met by making devices smaller and smaller. In other words, devices are becoming smaller even as their processing power increases. This has inevitably created a number of opportunities related to the packaging of these components. Among the more common problems in IC packaging is package warpage due to coefficient of thermal expansion (CTE) mismatches and poor adhesion between the lid and the body of a package. It has also become increasingly challenging to fit more decoupling capacitors into a single IC package as the need for power increases.

Thus, it is highly desirable to have a mechanically stable packaged device that has enough space for all the decoupling capacitors to be placed on the package substrate while maintaining the overall size of the IC package. In short, an IC package needs to be able to hold all the different components to accommodate the ever-increasing need for more processing power without sacrificing area or performance.

SUMMARY

Different embodiments of the present invention address the need to create an IC package that is both mechanically balanced and cost-effective in terms of area and performance.

In one embodiment, an integrated circuit is placed on a surface of a package substrate. A plurality of decoupling capacitors is placed on the surface of the package substrate surrounding the integrated circuit (IC). In order to reduce package warpage and create a mechanically balanced package structure, a rigid support member surrounding a peripheral edge of the IC is affixed to the package substrate through an adhesive spacer. The support member is elevated by the adhesive spacer so that the decoupling capacitors can be placed on a surface of the package substrate underneath the support member.

Another embodiment further describes a package structure with an integrated circuit placed on a substrate layer, a thermal interface material (TIM) disposed over the IC and mold-cap surrounds the IC and the TIM. The surrounding mold-cap has a thickness that is greater than a thickness of the IC and the TIM combined. A heat sink, shaped such that a portion of the heat sink is thick enough to fill a recess on top of the TIM surrounded by the mold-cap, is placed over the TIM and the mold cap. One skilled in the art will appreciate that having a heat sink with different thicknesses allows the thickness of the IC to be reduced without using a thicker thermal interface material (TIM).

In another aspect of the invention, a method for packaging an integrated circuit is provided. The method initiates by placing an IC on a packaging substrate. Then, a plurality of decoupling capacitors is disposed onto the packaging substrate surrounding the IC. A rigid support member is also affixed to the packaging substrate with an adhesive spacer such that the support member is elevated to allow decoupling capacitors to be placed on the packaging substrate underneath the support member. A molding compound is then injected into the IC package.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe a method and apparatus for packaging an integrated circuit. It will be obvious, however, to one skilled in the art, that the present invention may be practiced without some or all of these specific details. In other instances, well known process operations have not been described in detail in order not to unnecessarily obscure the present invention.

The embodiments described herein provide techniques to reduce package warpage and improve lid adhesion to a package body. At the same time, more space in the package is created for the placement of decoupling capacitors without increasing the size of the overall IC package. Decoupling capacitors are needed in an integrated circuit (IC) package because they provide power supply filtering. Decoupling capacitors are used to supply or control transient currents in a more timely manner than can be supplied by an active power circuit. Therefore, more decoupling capacitors are needed in a high performance system. The embodiments of the present application reduce package warpage by addressing the coefficient of thermal expansion (CTE) mismatch in packaging materials. A support member (rigid support member) embedded in the package creates a more balanced package structure to further eliminate package warpage. The embodiments described also ensure better lid. i.e., heat sink, to package adhesion by increasing the contact area between the lid and the molding material in the package. In addition, the lid or heat sink is configured to have different thicknesses to support ICs having varying thicknesses without having to increase a thermal integrate material layer thickness.

Figure 1:
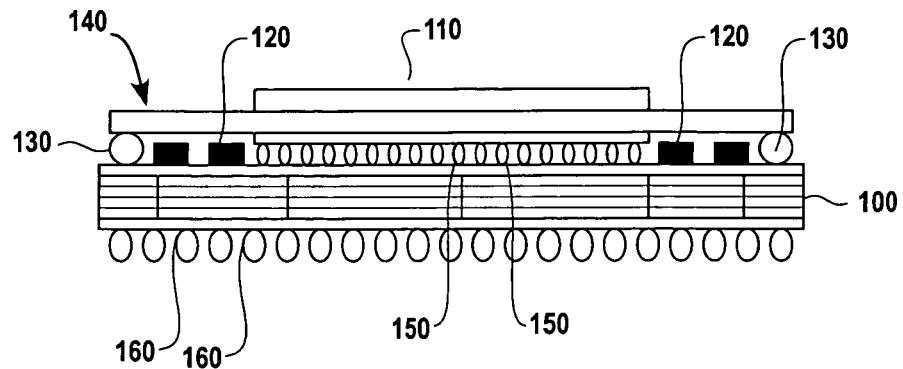
FIG. 1 shows an integrated circuit package with a rigid support member elevated though adhesive spacers in accordance with one embodiment of the invention.

A cross sectional view of an integrated circuit (IC) package without a lid is illustrated in FIG. 1 in accordance with one embodiment of the invention. Integrated circuit (IC) 110 is disposed onto a surface of package substrate 100. Solder bumps 150 are positioned on the corresponding substrate contact pads of package substrate 100. A plurality of decoupling capacitors 120 is disposed onto a peripheral region of package substrate 100 disposed outside of a perimeter of IC 110. Signals from the IC 110 are transmitted outside of the IC package, e.g., to a printed circuit board, through solder bumps 160 that are attached to contact pads on a bottom surface of package substrate 100. A rigid support member (also referred to as a support member) 140, is affixed to the surface of package substrate 100 through adhesive spacer 130. In one embodiment, support member 140 is a copper member having a shape consistent with an outer peripheral region of package substrate 100. Adhesive spacer elevates rigid support member 140 by about 1 mm from a surface of package substrate 100 to free up additional real estate on package substrate 100 for decoupling capacitors 120.

It should be appreciated that support member 140 of FIG. 1 is disposed around a periphery of IC 110. Support member 140 may be composed of any rigid material and the copper embodiment is exemplary and not meant to be limiting. In one embodiment, support member 140, the adhesive spacer 130, and the substrate layer 100 have similar coefficients of thermal expansion (CTE). Adhesive spacer 130 has a thickness suitable to provide space for a decoupling capacitor 120 disposed on the top surface of the package substrate 100, so that the capacitors can be placed on the substrate layer 100 underneath support member 140. Accordingly, elevating support member 140 with adhesive spacer 130 creates more space on the IC package for the placement of multiple components. Adhesive spacer may be composed of suitable thermoset or thermoplastic adhesive materials commercially available. These adhesive materials may be phenolic resins in one embodiment. In another embodiment, the adhesive spacer is a stencil printable adhesive material having a relatively high thixotropic index. One skilled in the art will appreciate that the thixotropic index is a ratio of a material's viscosity at two different speeds. Alternatively, the adhesive spacer may be a commercially available epoxy mold compound or a dam material. In another embodiment, the adhesive spacer has a CTE, a glass transition temperature (Tg) and a Young's modulus (E) that is similar to the epoxy mold compound in order to provide for enhanced packaging stability.

Figure 2:
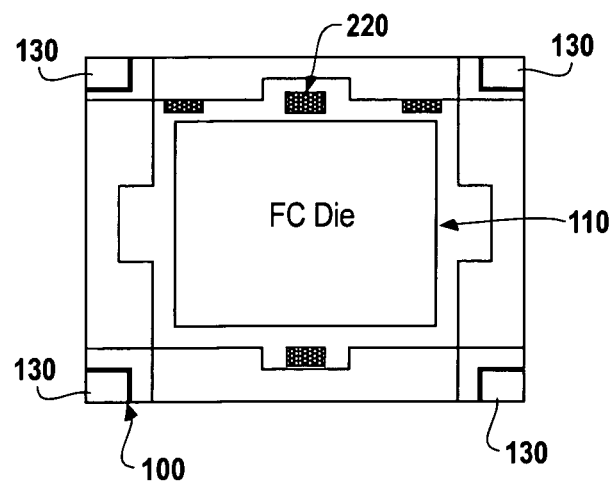
FIG. 2 illustrates a top view of an integrated circuit package in accordance with one embodiment of the invention.

FIG. 2 is a simplified schematic of a top view of an integrated circuit package layout having a rigid support member surrounding the integrated circuit in accordance with one embodiment of the invention. FIG. 2 illustrates mold-gates 220 around the IC 110. In one embodiment, the mold-gates 220 may act as an outlet for injecting a molding compound into the IC package after a lid or heat sink is placed over the IC package. In another embodiment, the molding compound can be an epoxy modeling compound that fills the area around IC 110 in the package. IC 110 is placed in a center region of package substrate 100. In one embodiment, the support member is configured to enable access to mold gates 220. It should be appreciated that decoupling capacitors may be placed around a peripheral region of package substrate 100 and a rigid support member disposed over the decoupling capacitors as detailed herein to provide added support to the package.

Figure 3:
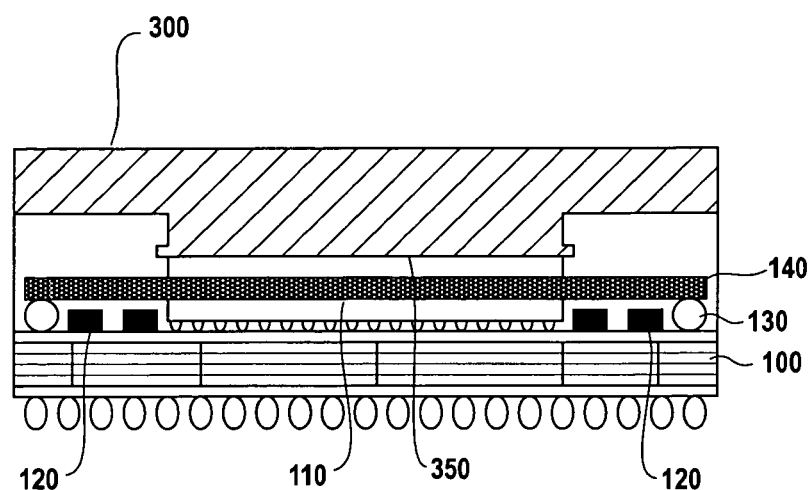
FIG. 3 shows an integrated circuit package with a rigid support member providing ample space for decoupling capacitors disposed thereunder in accordance with one embodiment of the invention.

In accordance with one embodiment of the invention, FIG. 3 shows an IC package with a lid and an embedded rigid support member providing enough headroom for decoupling capacitors to be disposed under the support member. Support member 140, attached to the top surface of package substrate 100 through adhesive spacer 130, improves warpage control. Support member 140 also creates a more mechanically balanced structure because the support member balances the coefficient mismatch between the package substrate 100 and IC 110. In one embodiment, support member 140 is affixed to package substrate 100 before the IC 110 is disposed on the package substrate. As mentioned above support member 140 may be disposed over adhesive spacers 130. In one embodiment, the adhesive spacers 130 are positioned at corners of the package substrate and support member is a monolithic member with a cavity defined in a center region to accommodate IC 110.

Also shown in FIG. 3 is a thermal interface material (TIM) 350 disposed over IC 110. In one embodiment, the TIM 350 is made of pulverized silver. However, TIM 350 may be any suitable material compatible with the application and capable of transferring heat generated from IC 110 to heat sink 300. TIM 350 is used to fill the gap between IC 110 and heat sink 300 to increase thermal transfer efficiency. TIM 350, as shown in FIG. 3, is thin enough for effective heat management, i.e., transfer of heat generated from IC 110 to heat sink 300. Heat sink 300 is thicker in the center region, which is disposed over IC 110 and TIM 350. By providing a thicker center region for Heat sink 300 and thereby minimizing the layer of TIM 350, the heat transfer is optimized. In one embodiment, heat sink 300 is attached to the package before a molding compound is injected into the IC package. It should be appreciated that the thickness of the center portion of heat sink 300 may be adjusted based on the thickness of IC 110. That is, the thickness of the center portion of the heat sink disposed over IC 110 is adaptable so that the thickness of TIM 350 is minimized. In one embodiment, the thickness of IC 110 is about 0.77 mm while the thickness of TIM 350 layer is about 100 microns. As feature sizes continue to shrink, the thickness IC 110 can drop to 0.3 mm or less. By similarly increasing the center portion of the heat sink, the TIM 350 layer can remain at the same thickness to optimize the heat transfer between IC 110 and heat sink 300.

Figure 4:
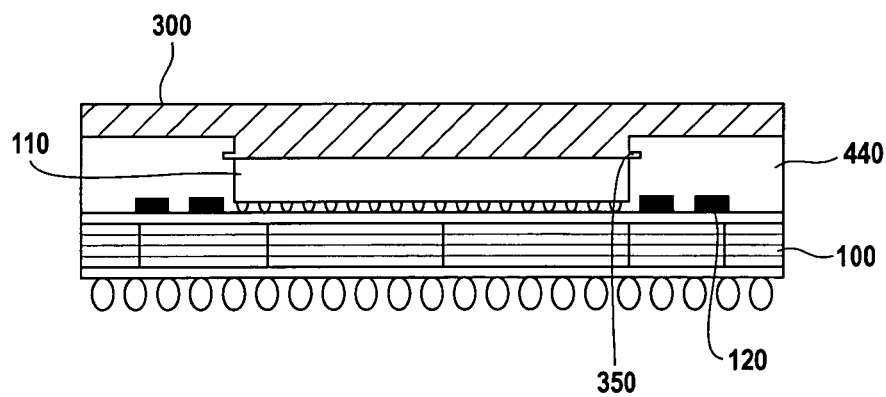
FIG. 4 shows an integrated circuit package with a pedestal heat sink in accordance with one embodiment of the invention.

In another embodiment in accordance with the invention, FIG. 4 illustrates an integrated circuit 110 disposed onto a substrate layer 100 and a thermal interface material (TIM) 350 disposed over the IC 110. A plurality of decoupling capacitors 120 is disposed on the surface of substrate 100 surrounding the integrated circuit 110. A mold cap 440 surrounds the IC 110, and heat sink 300 is disposed over both IC 110 and the surrounding mold cap 440. The mold cap 440 is thicker than the combined thickness of both the IC 110 and TIM 350. The mold cap 440 by being taller than a height of IC 110 and TIM 350 forms a recess defined above TN 350 and over IC 110. The combination of the thicker mold cap 440 and Heat sink 300 having a thicker center portion over IC 110 reduces package warpage. Heat sink 300 has a center portion that is thicker than the peripheral sides of the heat sink. The center portion of the heat sink 300 is disposed on the TIM 350, filling the recess thereabove and the sides of the Heat sink 300 are supported by the mold cap 440 surrounding the TIM 350 and IC 110. The Heat sink 300 is shaped in such a way that eliminates the need to have a thicker TIM 350. Thus, the heat dissipation is improved as a result of the minimization of the thickness of TIM 350. In one embodiment, the thickness of the TIM is about 100 microns, however this thickness is not meant to be limiting as the thickness may vary. In another embodiment, Heat sink 300 is made of oxygen-free copper for high conductivity and efficient heat dissipation of heat energy, however, this is exemplary and not meant to be limiting as Heat sink 300 may be any material capable of conducting and dissipating heat generated from IC 110.

Figure 5:
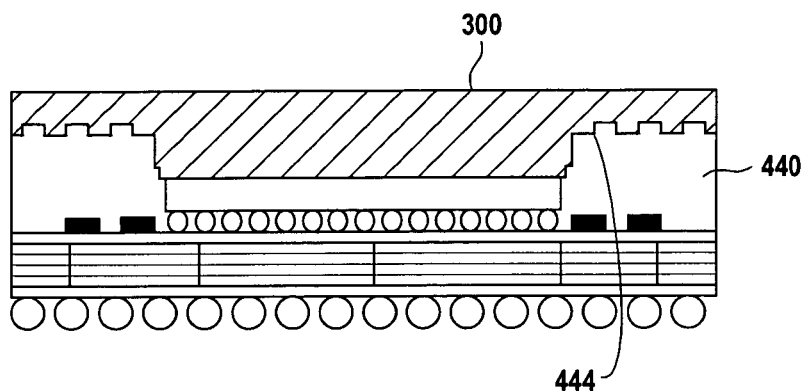
FIG. 5 is a simplified schematic diagram illustrating a package with a pedestal heat sink with channeled sides in accordance with one embodiment of the invention.

In yet another embodiment, the sides of the package lid may be shaped differently to provide better adhesion between the package lid and the surrounding mold cap. In FIG. 5, the Heat sink 300 is shown as having uneven bottom surface 444 of the sides of the lid disposed over mold cap 440. The uneven bottom surface of the side extensions of heat sink 300 may also be referred to as channeled, grooved, irregular, non-planar or non-linear. The uneven bottom surface of the side extensions provide a larger contact area between heat sink 300 and the mold cap 440 compared to a lid with an even surface as illustrate with reference to FIG. 4. In one embodiment heat sink 300 has side extensions with a bottom surface that is serrated with a plurality of grooves, e.g., in a saw tooth pattern. However, it should be appreciated that Heat sink 300 shown in FIG. 5 is only meant to be exemplary and not limiting as any configuration increasing the surface contact area between Heat sink 300 and mold cap 440 may be included with the embodiments described herein. One skilled in the art should appreciate that a lid with alternative shapes can be used as long as the lid is shaped in such a way that maximizes the contact area between the lid and the mold cap. It should be noted that the larger contact area between the side extensions of heat sink 300 and the mold cap 440 minimizes cracks on the IC package.

Figure 6:
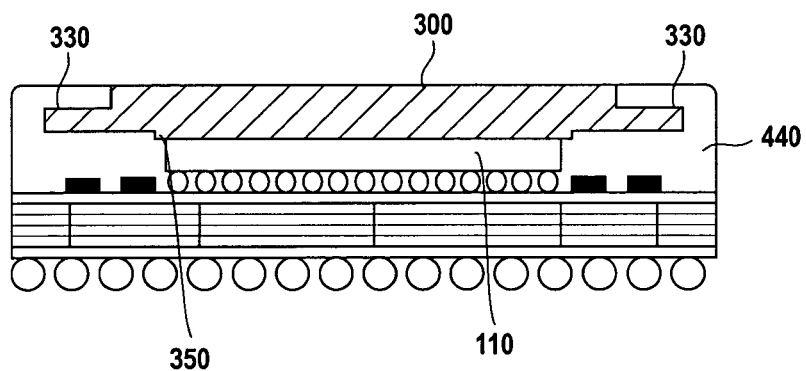
FIG. 6 illustrates an alternative embodiment of a semiconductor package in accordance with the invention.

FIG. 6 illustrates an alternative embodiment of a semiconductor package in accordance with the invention. The embodiment shown in FIG. 6 provides for improved warpage control through an alternative configuration for heat sink 300. The IC package shown in FIG. 6 portrays heat sink 300 as having embedded extensions 330 extending along a peripheral region of heat sink 300. Extensions 330 of heat sink 300 do not extend to the edge of the IC package and are embedded into mold cap 440 surrounding integrated circuit 110 and thermal interface material 350. The embedded extensions 330 reduce package warpage by providing enhanced structural integrity through the surrounding of the top, bottom and side surfaces of extensions 330 within mold cap 440. The Heat sink 300 shown in FIG. 6 is meant to be illustrative and not limiting as one skilled in the art should appreciate that alternative side configurations for the lid can be embedded into the mold cap 440. In addition, while a flip chip package with a ball grid array is provided in FIGS. 1-6, this is not meant to be limiting as the techniques described herein may be applied to alternative packaging configurations. In addition, the embodiments of FIGS. 4-6 may incorporate the rigid support member and the mold cap can be injected around the rigid support as illustrated with reference to FIG. 3.

Figure 7:
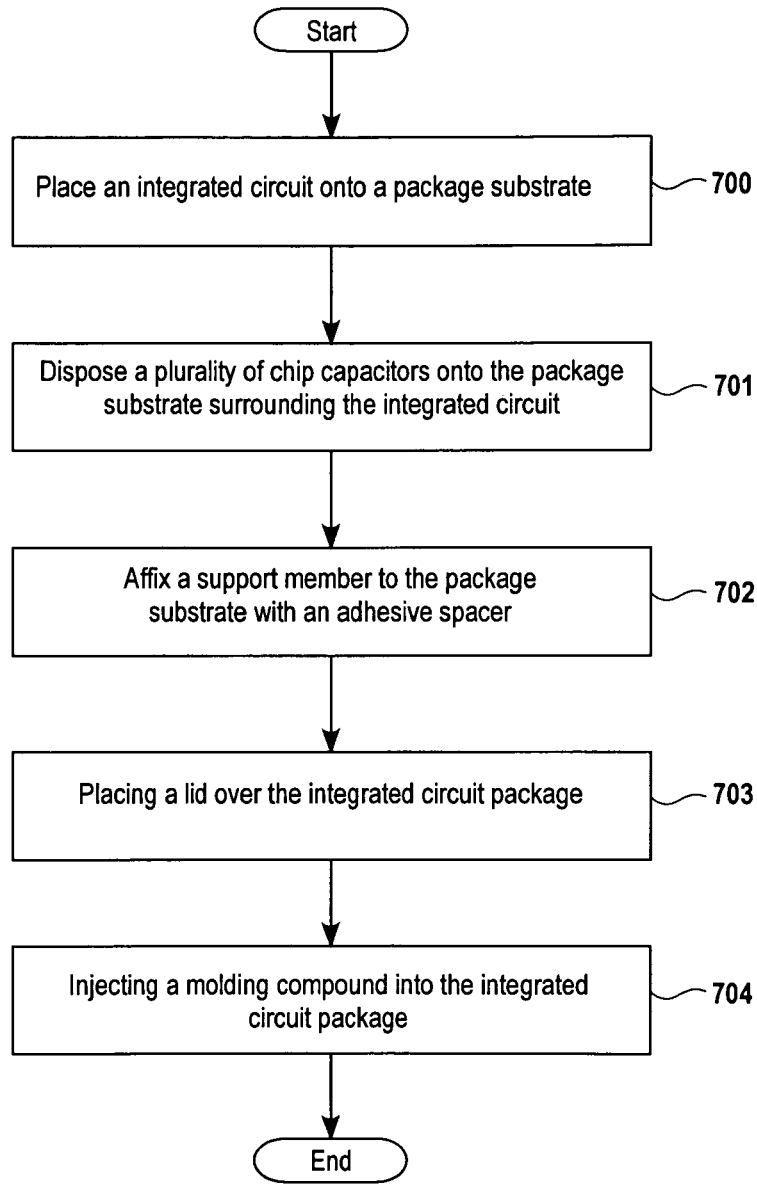
FIG. 7 is a flowchart diagram illustrating the method operations for packaging an integrated circuit in order to fit decoupling capacitors into an IC package without increasing the size of the IC package in accordance with one embodiment of the invention.

FIG. 7 shows the method operations for packaging an integrated circuit in order to fit decoupling capacitors into an IC package without increasing the size of the IC package in accordance with one embodiment of the invention. The packaging method shown in FIG. 7 reduces package warpage and creates a more balanced and stronger structure for the IC package to withstand stresses experienced due to the different materials incorporated into the package. An integrated circuit is placed on a package substrate in operation 700. A plurality of decoupling capacitors is then disposed on a peripheral region of a surface of the package substrate surrounding the integrated circuit in operation 701. A rigid support member is affixed to the substrate layer with an adhesive spacer in operation 702. The adhesive spacer elevates the support member so that the decoupling capacitors can be disposed onto the surface of the package substrate underneath the support member. By elevating the support member with an adhesive spacer, more decoupling capacitors can be disposed onto the package substrate without having to use a larger substrate. A lid or heat sink is then disposed onto the thermal interface material, which is disposed over the integrated circuit in operation 703. A molding compound is then injected into the IC package, e.g., through the mold-gates with reference to FIG. 2. The molding compound fills the IC package to surround the inner components, i.e., defines the mold cap described above. An epoxy molding compound (EMC) is preferably used for the molding compound in operation 704, but this is exemplary and not meant to be limiting. In one embodiment, the CTE for the rigid support member, and the epoxy molding compound are relatively similar, e.g., within about 15%. In another embodiment, the CTE of the adhesive spacer and the epoxy molding compound are relatively similar, e.g., within about 15%. For example, the CTE of the die may be 3 ppm, while the stiffener or rigid support member is about 18 ppm, when copper is used, while the adhesive spacer and epoxy molding compounds have relatively similar CTEs, e.g., about 16-18 ppm.

Although the method operations were described in a specific order, it should be understood that other housekeeping operations may be performed in between operations, or operations may be adjusted so that they occur at slightly different times, as long as the processing of the overlay operations are performed in the desired way.

Even though the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit package, comprising:
    an integrated circuit (IC);
    a packaging substrate onto which the IC is disposed, the packaging substrate having a plurality of decoupling capacitors disposed on a planar top surface of the packaging substrate;
    a support member surrounding a peripheral edge of the IC, the support member affixed to the planar top surface of the packaging substrate through an adhesive spacer, the adhesive spacer being configured to enable the plurality of decoupling capacitors to be disposed under and spaced apart from a bottom surface of the support member, the adhesive spacer disposed on the planar top surface of the packaging substrate and extending therefrom, the support member composed of a conductive material and the support member forming a cavity through a center region of the support member, the cavity sized such that the IC fits therethrough; and
    molding compound injected into the integrated circuit package, the molding compound filling areas around the IC and below and above the support member, wherein edges of the cavity of the support member are spaced far apart from edges of the IC for reaching below the bottom surface of the support member and further contacting the entire planar top surface of the support member.

2. The IC package of claim 1, wherein the support member is composed of copper and the adhesive spacer is a stencil printable adhesive material.

3. The IC package of claim 1, further comprising:
    a thermal interface material (TIM) disposed onto a top surface of the IC; and
    a heat sink disposed over the TIM.

4. The IC package of claim 3, wherein a center portion of a bottom surface of the heat sink extends outward toward a top surface of the TIM, and wherein the center portion of the heat sink is thicker than a peripheral region of the heat sink.

5. The IC package of claim 3, wherein a bottom surface of the heat sink is spaced apart from a top surface of the support member.

6. The IC package of claim 5, wherein an outer peripheral bottom surface of the heat sink is disposed on top of molding compound and wherein the molding compound is disposed over a top surface of the support member.

7. The IC package of claim 4, wherein an inner center region of the bottom surface of the heat sink extends outward past the outer peripheral bottom surface of the heat sink and wherein a surface of the inner center region contacts the TIM.

8. The IC package of claim 1, wherein the support member is rigid and is composed of copper, and wherein the adhesive spacer is disposed on corners of a surface of the packaging substrate.

9. The IC package of claim 1, wherein the integrated circuit is a programmable logic device.

10. The IC package of claim 9, wherein the support member is a planar support member having a thickness that is less than a thickness of the IC.

11. The IC package of claim 1, wherein the planar top surface of the package substrate extends over an entire surface of a core of the package substrate.

12. An integrated circuit package, comprising:
an integrated circuit (IC);
a packaging substrate onto which the IC is disposed, the packaging substrate having a plurality of decoupling capacitors disposed on a planar top surface of the packaging substrate;
a support member surrounding a peripheral edge of the IC, the support member affixed to the top surface of the packaging substrate through an adhesive spacer, wherein the plurality of decoupling capacitors is disposed under and spaced apart from a surface of the support member, the adhesive spacer disposed on the planar top surface of the packaging substrate and extending therefrom, the adhesive spacer having a height greater than a height of each decoupling capacitor of the plurality of decoupling capacitors, the support member comprising a conductive material and the support member forming a cavity through a center region of the support member, the cavity sized such that the IC fits therethrough; and
molding compound filling areas around the IC and surrounding the plurality of decoupling capacitors below the support member, wherein edges of the cavity of the support member are spaced far apart from edges of the IC for reaching below the bottom surface of the support member and further contacting the entire planar top surface of the support member.

13. The IC package of claim 12, wherein the support member comprises copper.

14. The IC package of claim 12 further comprising:
a thermal interface material (TIM) disposed onto a top surface of the IC; and
a heat sink disposed over the TIM.

15. The IC package of claim 12, wherein a center portion of a bottom surface of the heat sink extends outward toward a top surface of the TIM, the center portion of the heat sink being thicker than a peripheral region of the heat sink.

16. The IC package of claim 12, wherein the integrated circuit is a programmable logic device.

17. The IC package of claim 12, wherein the support member is a planar support member having a thickness that is less than a thickness of the IC.

* * * * *